US005999474A

United States Patent [19]
Leung et al.

[11] Patent Number: 5,999,474
[45] Date of Patent: Dec. 7, 1999

[54] METHOD AND APPARATUS FOR COMPLETE HIDING OF THE REFRESH OF A SEMICONDUCTOR MEMORY

[76] Inventors: Wingyu Leung, 10450 Orange Ave., Cupertino, Calif. 95014; Fu-Chieh Hsu, 21775 Congress Hall La., Saratoga, Calif. 95070, .

[21] Appl. No.: 09/165,228

[22] Filed: Oct. 1, 1998

[51] Int. Cl.[6] .................................................. G11C 7/00
[52] U.S. Cl. ........................................... 365/222; 365/49
[58] Field of Search ....................................... 365/222, 49

[56] References Cited

U.S. PATENT DOCUMENTS

| | | | |
|---|---|---|---|
| 5,295,109 | 3/1994 | Nawaki | 365/222 |
| 5,471,601 | 11/1995 | Gonzales | 365/222 |
| 5,559,750 | 9/1996 | Dosaka et al. | |
| 5,642,320 | 6/1997 | Jang | 365/49 |
| 5,659,515 | 8/1997 | Matsuo et al. | 365/222 |

OTHER PUBLICATIONS

Toshiba Corporation, "Toshiba MOS Digital Integrated Circuit," Toshiba Corporation, (Sep. 2, 1996).
Enhanced Memory Systems, Inc., "16Mbit Enhanced SDRAM Family 4M×4,2M×8, 1M×16" 2nd ed., (1997).
Mosys, Inc., "MD904 To MD920, 1/2 To 2 1/2 MByte Multibank DRAM (MDRAM) 128K×32 to 656K×32," (Feb. 21, 1997).
Kazushige Ayukawa et al., IEEE Journal of Solid–State Circuits, "An Access–Sequence Control Scheme to Enhance Random–Access Performance of Embedded DRAM's", IEEE J, vol. 33 (No. 5), (May, 1998).

*Primary Examiner*—Son T. Dinh
*Attorney, Agent, or Firm*—The Law Offices Of Bever & Hoffman, LLP

[57] ABSTRACT

A method and apparatus for handling the refresh of a DRAM array or other memory array that requires periodic refresh operations. The method and apparatus handles external accesses and refresh operations such that the refresh operations do not interfere with the external accesses under any conditions. As a result, an SRAM compatible device can be built from DRAM or 1-Transistor cells. The apparatus includes a multi-bank DRAM memory and an SRAM cache that stores the most recently accessed data. Each of the DRAM banks is operated with independent control, thereby enabling parallel refresh operations and read-write accesses to different banks. The capacity of the SRAM cache is selected such that refresh operations can be carried out even under the condition of indefinite 100% access of the multi-bank DRAM memory.

26 Claims, 4 Drawing Sheets

METHOD AND APPARATUS FOR COMPLETE HIDING OF THE REFRESH OF A SEMICONDUCTOR MEMORY

RELATED APPLICATIONS

The present application is related to U.S. patent application Ser. No. 09/037,396, by Wingyu Leung, entitled "Method and Apparatus for 1-T SRAM Compatible Memory" and filed Mar. 9, 1998, which is hereby incorporated by reference.

FIELD OF THE INVENTION

The present invention is related to semiconductor memories, especially dynamic random access memory (DRAM) and static random access memory (SRAM). In particular, the present invention relates to a method and apparatus of handling refresh operations in a semiconductor memory such that the refresh operations do not interfere with external access operations.

DISCUSSION OF RELATED ART

A conventional DRAM memory cell, which consists of one transistor and one capacitor, is significantly smaller than a conventional SRAM cell, which consists of 4 to 6 transistors. However, data stored in a DRAM cell must be periodically refreshed, while the data stored in an SRAM cell has no such requirement. Each refresh operation of a DRAM cell consumes memory bandwidth. For example, the cycle time of a 100 MHz DRAM array is 10 nsec. In this DRAM array, each external access takes 10 nsec, and each refresh access takes at least 10 nsec. Because an external access and a refresh access can be initiated at the same time, the DRAM array must be able to handle both within the allowable access cycle time so as to prevent the refresh access from interfering with the external access. This limits the minimum external access cycle time to be no less than 20 nsec, with 10 nsec for handling the external access and 10 nsec for handling the refresh access. This is true even though the refresh accesses are performed, on average, at a frequency of 62.5 kHz. As a result, the maximum accessing frequency of the DRAM array must be less than or equal to 50 MHz. Thus, a 100 Mhz DRAM memory array is required to create a device capable of operating at 50 MHz. This is simply not economical.

Previous attempts to use DRAM cells in SRAM applications have been of limited success for various reasons. For example, one such DRAM device has required an external signal to control refresh operations. (See, 131,072-Word by 8-Bit CMOS Pseudo Static RAM, Toshiba Integrated Circuit Technical Data (1996).) Moreover, external accesses to this DRAM device are delayed during the memory refresh operations. As a result, the refresh operations are not transparent and the resulting DRAM device cannot be fully compatible with an SRAM device.

In another prior art scheme, a high-speed SRAM cache is used with a relatively slow DRAM array to speed up the average access time of the memory device. (See, U.S. Pat. No. 5,559,750 by Katsumi Dosaka et al, and "Data Sheet of 16 Mbit Enhanced SDRAM Family 4M×4, 2M×8, 1M×16" by Enhanced Memory Systems Inc., 1997.) The actual access time of the device varies depending on the cache hit rate. Circuitry is provided to refresh the DRAM cells. However, the refresh operation is not transparent to external accesses. That is, the refresh operations affect the memory access time. Consequently, the device cannot meet the requirement of total deterministic random access time.

Other prior art schemes use multi-banking to reduce the average access time of a DRAM device. Examples of multi-banking schemes are described in "Data sheet, MD904 To MD920, Multi-bank DRAM (MDRAM) 128K× 32 to 656K×32" by MoSys Inc., 1996, and in "An Access-Sequence Control Scheme to Enhance Random-Access Performance of Embedded DRAM's" by Kazushige Ayukawa et al, IEEE JSSC, vol. 33, No. 5, May 1998, pp. 800–806. These multi-banking schemes do not allow an individual memory bank to delay a refresh cycle.

Accordingly, it would be desirable to have a memory device that utilizes area-efficient DRAM cells, and handles the refresh of the DRAM cells in a manner that is completely transparent to an accessing memory client externaL to the memory device. That is, it would be desirable for the refresh operations to be successfully performed without relying on unused external access time. Stated another way, it would be desirable to have a memory device that, allows the use of DRAM cells or other refreshable memory cells for building SRAM compatible devices or other compatible memory devices that do not require refresh.

SUMMARY

Accordingly, the present invention provides a memory device that includes a plurality of memory cells that must be periodically refreshed in order to retain data values, and a control circuit for accessing and refreshing the memory cells. In one embodiment, the memory cells are DRAM cells. The control circuit controls the accessing and refreshing of the memory cells such that the refreshing of the memory cells does not interfere with any external access of the memory cells.

The memory cells are arranged in a plurality of independently controlled memory banks. Thus, read, write and refresh operations are independently controlled within each bank. Each of the memory banks is coupled in parallel to a read buffer, such that data read from any one of the memory banks is provided to the read buffer. Each of the memory banks is further coupled in parallel to a write buffer, such that data written to any of the memory banks is provided from the write buffer.

The control circuit includes an SRAM cache, which has the same configuration as each of the memory bank,. A cache read buffer is coupled between an output port of the SRAM cache and the write buffer, thereby facilitating the transfer of data from the SRAM cache to the memory banks. Similarly, a cache write buffer is coupled between an input port of the SRAM cache and the read buffer, thereby facilitating the transfer of data from the memory banks to the SRAM cache. The cache read buffer and the cache write buffer are further coupled to an external data bus. The SRAM cache provides an interface between the external data bus and the memory banks. The SRAM cache implements a write-back policy, such that all write data is initially written to the SRAM cache before being written to the memory banks, and all read data provided to the external data bus is stored in the SRAM cache. In one embodiment, the SRAM cache is configured as a direct map cache. The SEAM cache is selected to have a capacity sufficient to ensure that each of the memory banks is refreshed properly within a predetermined refresh period. That is, even under the worst case cache-thrashing conditions, the required refresh operations will always be performed without delaying any external accesses to the memory device.

In one embodiment, the cache write-back policy is carried out as follows. First, a current access address received on the external data bus is compared with a cached address stored in the SRAM cache to determine whether a cache miss or a cache hit occurs. When a cache hit occurs, the requested data is either read from the SRAM cache (for a read access) or written to the SRAM cache (for a write access). Thus, the memory banks are not accessed when a cache hit occurs. Refresh operations can therefore be performed within the memory banks when a cache hit occurs, when a refresh request is pending. Because the memory banks are independently controlled, all of the memory banks can be simultaneously refreshed durinq a cache hit. Alternatively, predetermined sets of the memory banks can be simultaneously refreshed.

When a cache miss occurs, a determination is made as to whether the cache entry associated with the cached address contains data that has been modified. That is, a determination is made as to whether the cache entry contains the same data as the associated memory bank. A determination is also made as to whether the current access is a read access or a write access.

If a cache miss occurs and the data in the cache entry has not been modified, then processing proceeds as follows for read and write accesses. For a read access, the desired data is read from the memory bank associated with the current access address. This data is simultaneously provided to the external data bus and written to the SRAM cache, thereby overwriting the original cache entry. Because the original cache entry did not contain modified data, there is no need to write back the original cache entry under these conditions. For a write accese, a portion of the original cache entry is overwritten with the new data associated with the write access. The remaining portion of the original cache entry is overwritten with data retrieved from the memory bank identified by the current access address. Again, because the original cache entry did not contain modified data, there is no need to write back the original cache entry under these conditions. Note that only one memory bank needs to be accessed during a cache miss when the cache entry does not contain modified data.

If a cache miss occurs and the data in the cache entry has been modified, processing proceeds as follows. First, the cache entry is written back to the memory bank from which it originated. This write-back operation transfers the cache entry from the SRAM cache, through the cache read buffer and the write buffer, to the memory bank. At the same time, a new cache entry is read from a memory bank identified by the external access address. This new cache entry is written to the SRAM cache. This operation transfers the new cache entry from the memory bank, through the read buffer and the cache write buffer, to the SRAM cache. If the current access is a read access, then the new cache entry is simultaneously routed to the external data bus. If the access is a write access, then the write data is written to the SRAM cache along with the rest of the data of the new cache entry.

Note that only one or two memory banks are accessed during a cache miss. Thus, all of the other memory banks can be refreshed during a cache miss operation. Also note that because read and write accesses to the memory banks are performed simultaneously, each access can be completed during a single clock period. As a result, the memory device is accessed in the same manner as a conventional SRAM.

The present invention will be more fully understood in view of the following description and drawings.

DETAILED DESCRIPTION

In accordance with the present invention, an SRAM compatible device is designed using DRAM cells. This SRAM compatible device is hereinafter referred to as a one-transistor SRAM (1-T SRAM). The 1-T SRAM of the described embodiment has a capacity of 128K words, each word having a length of 32-bits. The 1-T SRAM includes 64 DRAM banks that can operate independent of each other so that parallel operations, such as read, write and refresh, can take place in different DRAM banks simultaneously. A mechanism is provided so that refresh access requests are simultaneously broadcast to multiple DRAM banks. The DRAM banks that receive the broadcast refresh request signal go through a refresh cycle only when there is no bank access pending. A refresh address is supplied locally inside each DRAM bank by its own address refresh counter. In the described embodiment, the refresh request is broadcast to all the DRAM banks. In another embodiment, the refresh request is only broadcast to a subset of the DRAM banks at any one time.

An SRAM cache is incorporated to store the data of the most recently accessed locations. The SRAM cache has a significantly smaller capacity than the DRAM banks. To ensure that all refresh accesses of the DRAM banks are properly performed within a predetermined refresh period, even under the worst case cache thrashing conditions, the size of the SRAM cache is selected to have a storage capacity equal to (or greater than) the storage capacity of one of the DRAM banks, minus the capacity of one row of cells in the DRAM bank. In light of simplicity of design, in the embodiment described below, the SRAM cache has a storage capacity equal to the storage capacity of a DRAM bank.

Figure 1:
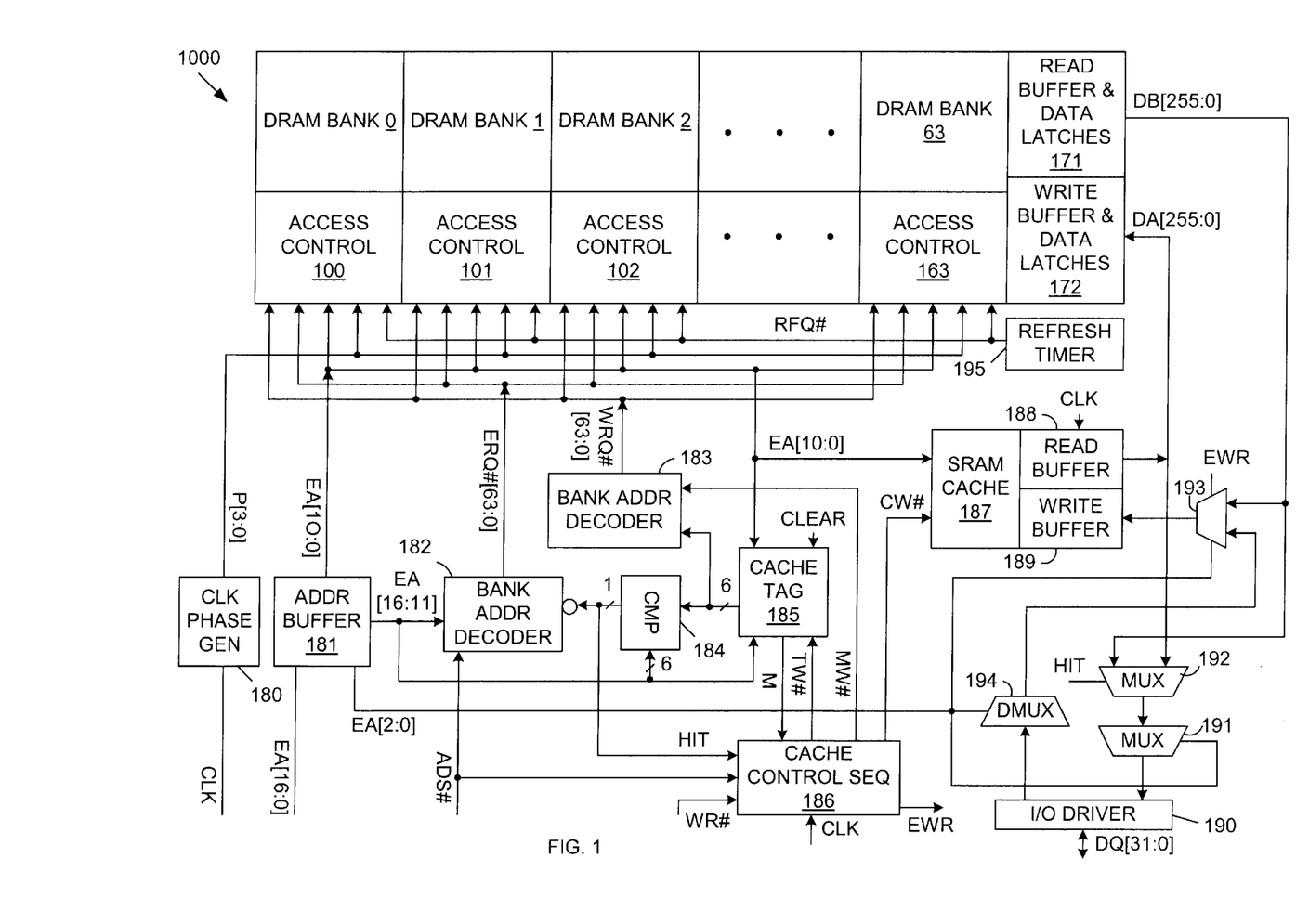
FIG. 1 is a block diagram of a 1-T SRAM in accordance with one embodiment of the present invention.

FIG. 1 is a block diagram of a 1-T SRAM 1000 in accordance with one embodiment of the present invention. 1-T SRAM 1000 includes sixty-four DRAM banks 0–63, and sixty-four corresponding access control circuits 100–163. As described in more detail below, access control circuits 100–163 are coupled to receive the address and control signals required to access DRAM banks 0–63. Each of DRAM banks 0–63 includes an array of 64 rows and 1024 columns of DRAM cells. The sixty-four DRAM banks 0–63 share a common read buffer/data latch circuit 171 and a common write buffer/data latch circuit 172. As described in more detail below, read and write data is transferred to and from banks 0–63 through circuits 171 and 172. Read buffer 171 and write buffer 172 operate independently, thereby allowing data to be read from one of DRAM banks 0–63 at the same time that data is being written to another one of DRAM banks 0–63.

1-T SRAM 1000 also includes clock phase generator 180, address buffer 181, bank address decoders 182–183, comparator 184, cache tag memory 185, cache control sequencer 186, SRAM cache 187, cache read buffer 188, cache write buffer 189, I/O driver 190, multiplexers 191–193, de-multiplexer 194 and refresh timer 195. These elements, which in general control the accesses of 1-T SRAM 1000, are described in more detail below.

1-T SRAM 1000 operates in response to the following signals: input/output (I/O) data signals DQ[31:0], external address signals EA[16:0], address strobe signal ADS#, write/read indicator WR#, and clock signal CLK (for the synchronization of memory transactions between 1-T SRAM 1000 and the outside world). As used herein, the # symbol indicates that a signal is active low. Note that the signals listed above do not include any signals relating to the refresh accesses of DRAM banks 0–63.

An external device initiates an access to 1-T SRAM 1000 by asserting a logic low address strobe signal ADS#, driving the write/read indicator signal WR# to the desired state, and providing a memory address EA[16:0]. The ADS# signal is provided to bank address decoder 182 and cache control sequencer 186. The access request is recognized by 1-T SRAM 1000 at the rising edge of the CLK signal that occurs after the ADS# signal is asserted low. The WR# signal is provided to cache control sequencer 186. The memory address EA[16:0] is provided to address buffer 181. The 17 address bits EA[16:0] are divided into 4 fields. Address bits EA[16:11] form a bank address field that identifies one of the sixty-four DRAM banks 0–63. Address bits EA[10:5] form a row address field that identifies one of the sixty-four rows in the addressed DRAM bank. Address bits EA[4:3] form a column address field that identifies one of the four 256-bit sections within the addressed row. Finally, address bits EA[2:0] form a byte address field that identifies one of the eight 32-bit words within the addressed 256-bit section.

Read or write data DQ[31:0] is provided to I/O driver 190 during the clock cycle after the access request is recognized. As described above, each of DRAM banks 0–63 includes an array of 64 rows and 1024 columns of DRAM cells. Each of DRAM banks 0–63 is coupled to read buffer 171 and write buffer 172. Read buffer 171 and write buffer 172 include transparent latches that latch read and write data during DRAM read and write operations, respectively. Both read buffer 171 and write buffer 172 include 256 Latches, thereby enabling these buffers to store one 256-bit section. Each of DRAM banks 0–63 has an associated independent access control circuit 100–163 to facilitate multi-bank parallel operations. Dedicated read bus DB[255:0] and dedicated write bus DA[255:0] are employed, so that one of DRAM banks 0–63 can perform a write operation while another one of DRAM banks 0–63 can perform a read operation simultaneously.

Figure 2:
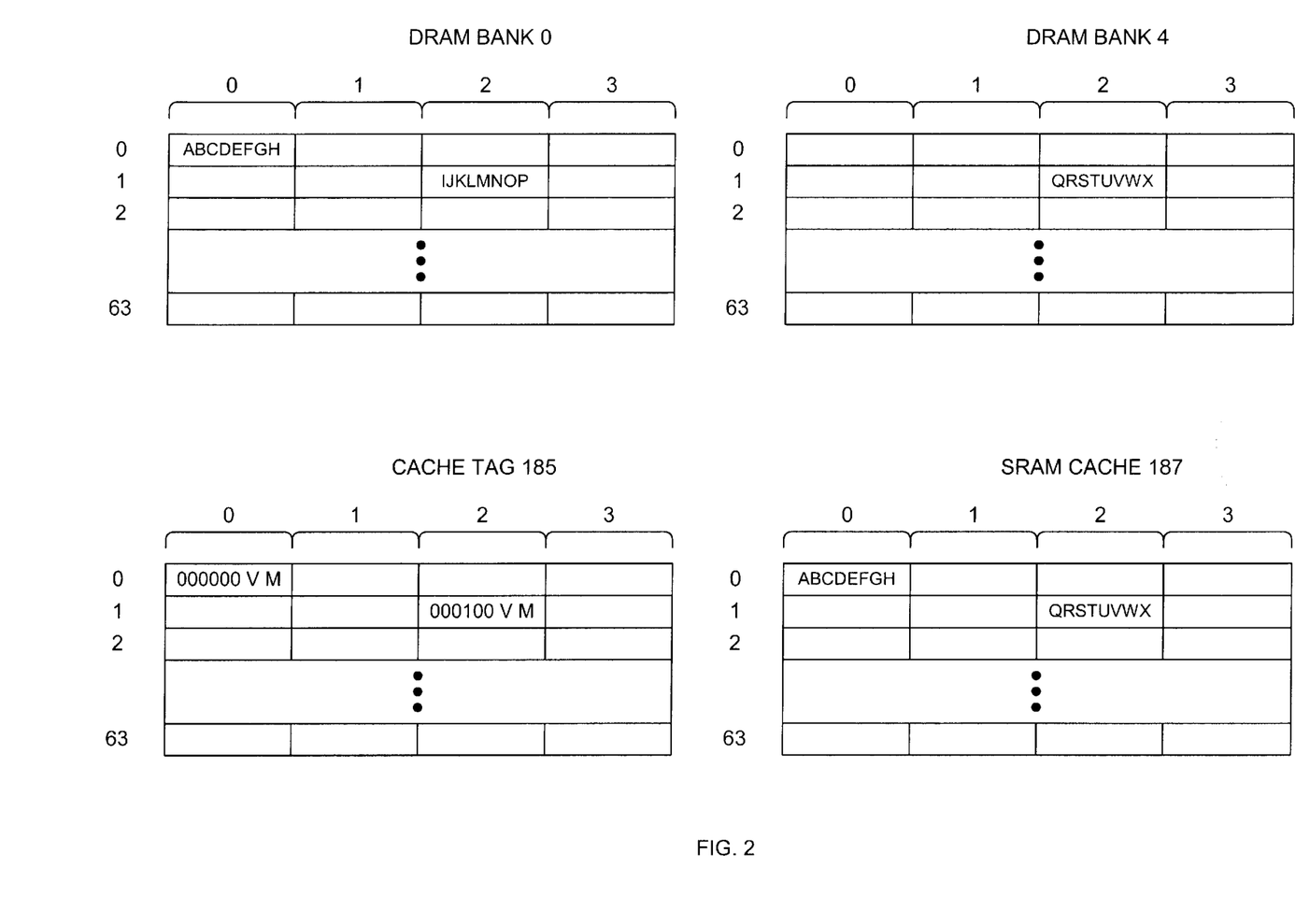
FIG. 2 is a block diagram illustrating the organization of DRAM banks, an SRAM cache memory and a cache tag memory in accordance with one embodiment of the present invention.

FIG. 2 is a block diagram illustrating the organization of DRAM banks 0–63, SRAM cache 187 and cache tag memory 185. Only DRAM banks 0 and 4 are illustrated in FIG. 2 for purposes of clarity. SRAM cache 187 has the same organization as DRAM banks 0–63. That is, SRAM cache 187 includes an array of 64 rows and 1024 columns of SRAM cells. The SRAM cells can be, for example, traditional four-transistor or six-transistor SRAM cells. The columns of DRAM banks 0–63 and the columns of SRAM cache 187 are logically divided into four sections, with each section having 256 columns (i.e., 256 bits). Row 0, section 0 of DRAM bank 0 stores 256 bits in the form of eight 32-bit words A, B, C, D, E, F, G and H. Row 1, section 2 of DRAM bank 0 stores 256 bits in the form of eight 32-bit words I, J, K, L, M, N, O and P. Row 1, section 2 of DRAM bank 4 stores 256-bits in the form of eight 32-bit words Q, R, S, T, U, V, W, and X.

As described in more detail below, SRAM cache 187 stores 256-bit cache entries from the various DRAM banks 0–63. For example, row 0, section 0 of SRAM cache 187 stores a cache entry received from row 0, section 0 of one of DRAM banks 0–63. Similarly, row 1, section 2 of SRAM cache 187 stores a cache entry received from row 1, section 2 of one of DRAM banks 0–63. In the example of FIG. 2, SRAM cache 187 stores the words A, B, C, D, E, F, G and H from DRAM bank 0 as the cache entry for row 0, section 0. Cache tag 185 stores the 6-bit bank address of DRAM bank 0 (i.e., 000000), thereby indicating that the contents of row 0, section 0 of SRAM cache 187 are associated with DRAM bank 0. Each entry of cache tag 185 also includes a valid indicator bit V and a modified indicator bit M, which are described in more detail below. In general, the valid indicator bit V is set to indicate a valid cache entry. The modified indicator bit M, when set, indicates that the associated cache entry has been modified, and that the associated cache entry stored in SRAM cache 187 must be written back to the associated DRAM bank during a cache miss access.

Also in FIG. 2, SRAM cache 187 stores the words Q, R, S, T, U, V, W, and X from DRAM bank 4 as the cache entry for row 1, section 2. Cache tag 185 stores the 6-bit bank address of DRAM bank 4 (i.e., 000100), thereby indicating that the contents of row 1, section 2 of SRAM cache 187 are associated with DRAM bank 4. The above described caching scheme is a direct mapped caching scheme.

Cache read buffer 188 and cache write buffer 189 are coupled to SRAM cache 187. Cache read buffer 188 and cache write buffer 189 enable SRAM cache 187 to perform a read operation and a write operation during the same cycle of the CLK signal. In another embodiment, SPAM cache 187 is fabricated using dual-port SRAM cells, which can be used to support read and write operations during a single cycle of the CLK signal. As described above, SRAM cache 187 is organized as a direct map cache with 256 cache entries, each cache entry containing 256 bits (i.e., eight 32-bit words). Uni-directional internal data bus DA[255:0] couples cache read buffer 188 to write buffer 172. Data bus DA[255:0] carries the data read from cache read buffer 188 to write buffer 172. Uni-directional internal data bus DB[255:0] couples cache write buffer 189 to read buffer 171 (through multiplexer 193). Data bus DB[255:0] carries the read data from read buffer 171 to cache write buffer 189 (through multiplexer 193).

During normal operations, an entire cache entry (256-bits) can be transferred from the read buffer 171 to SRAM cache 187 in one cycle of the CLK signal. Similarly, an entire cache entry can be transferred from SRAM cache 187 to write buffer 172 in one cycle of the CLK signal. Operations of SRAM cache 187 are controlled by cache control sequencer 186 with the help of cache tag memory 185.

The cache scheme is implemented as follows. When 1-T SRAM 1000 is powered up, an on-chip power-on reset circuit (not shown) asserts a CLEAR signal, which is applied to cache tag memory 185. In response to the CLEAR signal, all of the valid indicator bits V of cache tag memory 185 are reset to zero, thereby resetting cache tag memory 185. Whenever a cache entry is written to SRAM cache 1837, the valid indicator bit V in the associated cache tag entry is set to a logic one value.

A write-back policy is employed in the present invention. This is because a write-through policy, while simpler, would require that data be written to DRAM banks 0–63 for every write transaction that could cause a refresh problem (i.e., if one of banks 0–63 is written continuously for a period of time longer than the maximum allowed refresh period, the bank will not be refreshed properly, which in turn may cause data errors).

The write-back policy will now be described for the four possible read and write transactions of read hit, write hit, read miss and write miss.

When an access is initiated by an external circuit, an address EA[16:0] is provided to address buffer 181. Address buffer 181, in turn, routes this address EA[16:0] to cache tag memory 185. This address EA[16:0] identifies a DRAM bank, row and section being accessed. For example, address EA[16:0] could identify DRAM bank 4, row 1, section 2. In response to address EA[16:0], cache tag memory 185 accesses the bank address stored in the identified row and section. In the described example, cache tag memory 185 would retrieve the bank address stored in row 1, section 2, or 000100. Cache tag memory 185 provides this retrieved bank address to comparator 184. Cache tag memory 185 also provides the modified bit M associated with the retrieved bank address to cache control sequencer 186.

Comparator 184 compares the bank address retrieved from cache tag memory 184 with the current bank address EA[16:11]. If comparator 184 detects a match, then a cache hit exists, and comparator 184 asserts a HIT control signal. If comparator 184 does not detect a match, then a cache miss exists, and comparator 184 does not assert the HIT control signal. The HIT control signal is provided to bank address decoder 182 and cache control sequencer 186.

In response to the ADS#, WR#, M and HIT signals, cache control sequencer 186 determines whether the current access is a read hit, write hit, read miss or write miss access.

If the current access is a read hit access, then SRAM cache 187 contains the desired data. Cache control sequencer 186 therefore causes SRAM cache 187 to provide the desired data to cache read buffer 188. The desired data is routed from cache read buffer 188 to multiplexer 192. Multiplexer 192 routes this data to multiplexer 191 in response to the asserted HIT control signal. Multiplexer 191 routes the one of the eight 32-bit words to I/O driver 190 in response the byte select address bits EA[2:0]. I/O driver 190 drives the selected word on data bus DQ[31:0]. Because DRAM banks 0–63 are not accessed during a read hit access, all of DRAM banks 0–63 are able to perform refresh operations during a read hit access.

If the current access is a write hit access, then SRAM cache 187 stores a cache entry which corresponds with the addressed DRAM bank, row and section. Under these conditions, cache control sequencer 186 causes the external write data to be written to this cache entry, rather than to the addressed DRAM bank. For example, assume that the current write access specifies writing a 32-bit word Z to the last word position of DRAM bank 4, row 1, section 2 (See, FIG. 2). Because the contents of this address (i.e., 32-bit word X) are already stored in SRAM cache 187, a cache write hit exists. The word Z is provided to I/O driver 190 on data bus DQ[31:0]. I/O driver 190 routes the word Z to de-multiplexer 194. In response to the byte address EA[2:0], de-multiplexer routes the word Z on a set of bus lines corresponding to the appropriate word position. The word Z is routed through multiplexer 193, in response to the external write enable signal EWR, to cache write buffer 189. Cache write buffer 189 provides the word Z to overwrite the word X stored in row 1, section 2 of SRAM cache 187. Cache control sequencer 186 also causes the modified indicator bit M associated with row 1, section 2 of cache tag memory 185 to be set. Because DRAM banks 0–63 are not accessed during a write hit access, all of DRAM banks 0–63 can be refreshed during a write hit access.

If the current access is a read miss access, then SRAM cache 187 does not store a cache entry which corresponds with the addressed DRAM bank, row and section. For example, assume that a read operation attempts to access row 1, section 2 of DRAM bank 0 (FIG. 2). A cache miss will be detected because the words Q, R, S, T, U, V, W and X from DRAM bank 4 are stored in the associated entry of SRAM cache 187. Upon detecting the read miss condition, if the modified bit M associated with the cache tag entry is set, cache control sequencer 186 causes the cache entry causing the miss to be written back to its associated DRAM bank. This write-back operation is only required if the modified bit M has been set. If the modified bit M has not been set, then the data stored in SRAM cache 187 is consistent with the data stored in the associated DRAM bank, and no write-back is required. In the present example, the write-back operation consists of the words Q, R, S, T, U, V, W and X being routed from row 1, section 2 of SRAM cache 187 to row 1, section 2 of DRAM bank 4 through cache read buffer 188 and write buffer 172.

At the same time, cache control sequencer 186 initiates a read operation to row 1, section 2 of DRAM bank: 0. Data words I, J, K, L, M, N, O and P are read from row 1, section 2 of DRAM bank 0, routed through read buffer 171, multiplexer 193 and cache write buffer 189, and are written to row 1, section 2 of SRAM cache 187. In addition, the cache tag entry associated with row 1, section 2 is updated to reflect the bank address of DRAM bank 0 (i.e., 000000) and the modified bit M of this cache tag entry iE. reset to zero to indicate that the data stored in SRAM cache 187 is consistent with the data stored in DRAM bank 0. The data words I, J, K, L, M, N, O and P are also routed through multiplexer 192 in response to the de-asserted HIT control signal. Multiplexer 191 routes a selected one of data words I, J, K, L, M, N, O and P to I/O driver 190 (and thereby to data bus DQ[31:0]) in response to byte select adoress EA[2:0]. For example, multiplexer 191 may route data word M to I/O driver 190. Note that during a read miss access, all of the DRAM banks other than the DRAM banks involved in the read or write-back operations can be refreshed.

If the current access is a write miss access, then SRAM cache 187 does not store a cache entry which corresponds with the addressed DRAM bank, row and section. For example, assume that a write operation attempts to write e word Z to row 1, section 2 of DRAM bank 0 (FIG. 2). A cache miss will be detected because the words Q, R, S, T, U, V, W and X from DRAM bank 4 are stored in the associated cache entry of SRAM cache 187. Upon detecting the write miss condition, if the modified bit associated with the cache tag entry is set, cache control sequencer 186 causes the cache entry causing the miss to be written back to its associated DRAM bank. This write-back operation is only required if the modified bit M has been set. If the modified bit M has not been set, then the data stored in SPAM cache 187 is consistent with the data stored in the associated DRAM bank, and no write-back is required.

In the present example, the words Q, R, S, T, U, V, W and X are routed from row 1, section 2 of SRAM cache 187 to row 1, section 2 of DRAM bank 4 through cache read buffer 188 and write buffer 172. At the same time, cache control sequencer 186 initiates a read operation to row 1, section 2 of DRAM bank 0. Data words I, J, K, L, M, N, O and P are read from row 1, section 2 of DRAM bank 0, and are routed through read buffer 171 to multiplexer 193. The 32-bit data word Z to be written in accordance with the current write access is also provided to multiplexer 193 (through data bus DQ[31:0], I/O driver 190, and de-multiplexer 194).

Multiplexer 193 routes seven of the eight data words I, J, K, L, M, N, O and P, plus the data word Z to cache write buffer 189 in response to the byte address EA[2:0]. For example, if byte address EA[2:0] identifies first data word position, then multiplexer 193 routes words Z, J, K, L, M, N, O and P to cache write buffer 189. These data words are then written from cache write buffer 189 to row 1, section 2 of SRAM cache 187. In addition, cache tag memory 185 is updated by writing the bank address associated with DRAM bank 0 to row 1, section 2 of cache tag memory 185. The modified indicator bit M of this cache tag entry is also set at this time, thereby indicating that the cache entry in SRAM cache 187 is not the same as the corresponding data in DRAM bank 0 (i.e., SRAM cache 187 contains Z, J, K, L, M, N, O and P, while DRAM bank 0 contains I, J, K, L, M, N, O and P). Note that during a write miss access, all of the DRAM banks other than the DRAM banks involved in the read and write-back operations can be refreshed.

DRAM Operations

Figure 3:
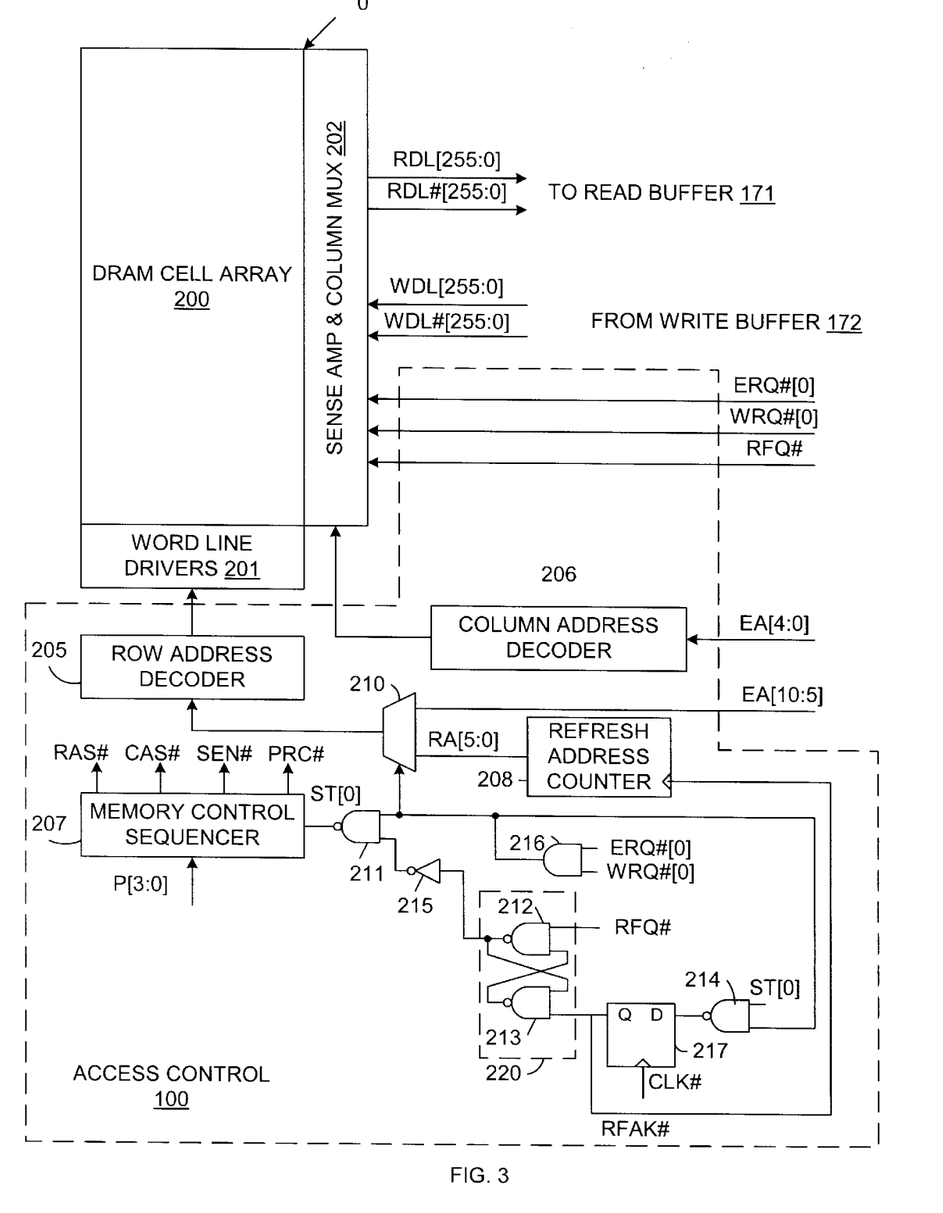
FIG. 3 is a schematic diagram of a DRAM bank and an associated access control circuit in accordance with one embodiment of the present invention.

FIG. 3 is a schematic diagram of DRAM bank 0 and access control circuit 100. Because each of DRAM banks 1–63 is identical to DRAM bank 0, and each of access control circuits 101–163 is identical to access control circuit 100, only DRAM bank 0 and access control circuit 100 are described in detail. DRAM bank 0 consists of a DRAM cell array 200 having 64 rows and 1024 columns. DRAM bank 0 further includes all the conventional circuits associated with a DRAM array, such as word line drivers 201 and sense amplifiers & column multiplexers 202. Data buses RDL[255:0] and RDL#[255:0] couple DRAM bank 0 to read buffer 171. Data buses WDL[255:0] and WDL#[255:0] couple DRAM bank 0 to write buffer 172. Access control circuit 100 includes row address decoder 205, column address decoder 206, memory control sequencer 207, refresh address counter 208, address multiplexer 210, and access arbitration logic for regulating the external accesses and the refresh accesses. The access arbitration logic includes NAND gates 211–214, inverter 215, AND gate 216 and flip-flop 217.

Memory control sequencer 207 generates the access control signals RAS# (row access), CAS# (column access), SEN# (sense amplifier enable), and PRC# (pre-charge) for controlling the operations of DRAM bank 0. These control signals are described in more detail in commonly owned co-pending U.S. patent application Ser. No. 09/076,608, "Method and Structure for Controlling Operation of a DRAM array", by Wingyu Leung, which is hereby incorporated by reference in its entirety. In general, the RAS#, CAS#, SEN# and PRC# signals are generated at predetermined times within a single cycle of the CLK signal, wherein the predetermined times are determined with respect to the rising and falling edges of the CLK signal. As a result, DRAM bank 0 completes a memory cycle in one cycle of the CLK signal. The timing of the RAS#, CAS#, SEN# and PRC# control signals are controlled by the four phase clock signals P[3:0] generated by clock phase generator 180 (FIG. 1). Clock phase generator 180 generates phase clock signals P[3:0] in response to the CLK signal using a delay line scheme. Clock phase generator 180 is described in more detail in U.S. patent application Ser. No. 09/076,608. Since a memory cycle takes only one clock period, DRAM bank 0 can process one random access or one row refresh during one clock cycle.

A memory cycle is initiated when NAND gate 211 asserts a logic high ST[0] signal to memory control sequencer 207. The ST[0] signal is driven high when any of the three following signals is asserted low: read request signal ERQ#[0], write request signal WRQ#[0], or refresh request signal RFQ#. The designator [0] corresponds with the DRAM bank address. Thus, DRAM bank 23 would have similar signals ST[23], ERQ#[23] and WRQ#[23]. Note that each of DRAM banks 0–63 is thereby independently controlled.

Read request signal ERQ#[0] is generated by bank address decoder 182 (FIG. 1). Read request signal ERQ#[0] is asserted low when a cache miss occurs and data must be read from DRAM bank 0 as a result of the cache miss. The conditions under which such a read access may be required have been described above in connection with the write miss and read miss accesses.

Write request signal WRQ#[0] is generated by bank address decoder 183 (FIG. 1). Write request signal WRQ# [0] is asserted low when a cache miss occurs and data stored in SRAM cache 187 must be written back to DRAM bank 0. The conditions under which a write-back operation is required have been described above in connection with the write miss and read miss accesses.

Read request signal ERQ#[0] and write request signal WRQ#[0] are mutually exclusive. That is, these signals cannot be activated at the same time. This is because during a cache miss access, the bank address associated with the cache entry being replaced is necessarily different than the bank address associated with the data being retrieved from a DRAM bank. However, either write request signal WRQ# [0] or read request signal ERQ#[0] can be asserted low at the time that the refresh request signal RFQ# is asserted low to initiate a refresh access. As described below, both the write request signal WRQ#[0] and the read request signal ERQ# [0] always have priority over the refresh request signal RFQ#. As a result, accesses to DRAM bank 0 (and accesses to DRAM banks 1–63) are never delayed by refresh accesses.

Refresh Operation

Refresh timer 195 (FIG. 1) is a 15-bit binary counter. At 100 MHz operation, refresh timer 195 generate, a refresh request every 320 $\mu$s. Each of memory banks 0–63 is refreshed independently, with one row of a memory bank being refreshed during one refresh cycle. A refresh access is implemented by reading a row of a DRAM bank. Reading a row of a DRAM bank has the effect of refreshing the charge in the DRAM cells in the row. Sixty four refresh cycles are required to completely refresh all 64 rows of a DRAM bank. The refresh time for 1-T SPAM 1000 is thus 320 $\mu$s times 64 or 20.48 ms.

The output of refresh timer 195 provides the refresh request RFQ# signal, which is activated for one clock cycle when refresh timer 195 reaches a full count, that is, when all the counter bits are high. Because the period of refresh timer 195 is 320 $\mu$s and it takes only 64×4×10 ns (64 rows, 4 cache line per row) or 2.56 $\mu$s to completely access all of the cache entries of SRAM cache 187, at least one cache hit or memory idle cycle will occur in each of DRAM banks 0–63 during each refresh timer period. This guarantees that none of DRAM banks 0–63 will miss a refresh cycle, and that each of DRAM banks 0–63 will be refreshed in a timely manner.

However an access collision can occur when a refresh request and an external access request (i.e., a cache miss access) are generated during the same clock cycle. The access collision is handled in the DRAM bank by processing the cache miss access first and delaying the refresh request by saving the low state of the refresh request signal RFQ# in a flip-flop. The refresh accumulation flip-flop 220 is formed by the NAND gates 212 and 213 in FIG. 3. The cache miss access always takes priority over the refresh access to ensure that the external memory access is always completed without delay. As a result, the DRAM bank refresh accesses are transparent to the outside world, thereby making 1-T SRAM 1000 behave in a manner that is completely compatible with an SRAM device.

The access priority is set by address multiplexer 210, which is controlled to provide either the row address EA[10:5] or the refresh row address RA[5:0] to row address decoder 205. Row address EA[10:5] is the row address associated with a cache miss access. Address multiplexer 210 is controlled by the output signal provided by AND gate 216. The input terminals of AND gate 216 are connected to receive the read request signal ERQ#[0] and the write request signal WRQ#[0]. When either of these request signals is asserted low, address multiplexer 210 selects row address EQ[10:5] for the current memory cycle. In the absence of cache miss access, both ERQ#[0] and WFRQ#[0] are de-asserted high, thereby causing multiplexer 210 to route refresh address RA[5:0] to row address decoder 205.

The refresh access is delayed until the DRAM bank is idle. Flip-flop 220 is set when the refresh request signal RFQ# is asserted low. Flip-flop 220 remains in the set state until the refresh acknowledge signal RFAK# is asserted low. The refresh acknowledge signal RFAK# is asserted low when the signals ST[0], ERQ#[0] and WRQ#[0] are high. When all these signals are high, a refresh access is initiated. Flip-flop 217 synchronizes the resetting of flip-flop 220 with the CLK signal. Six-bit refresh address counter 208 keeps track of the row address to be refreshed. Refresh address counter 208 is incremented for every low to high transition of the RFAK# signal. After refresh address counter 208 reaches the full count 111111, it resets to 000000.

Operations Timing

Figure 4:
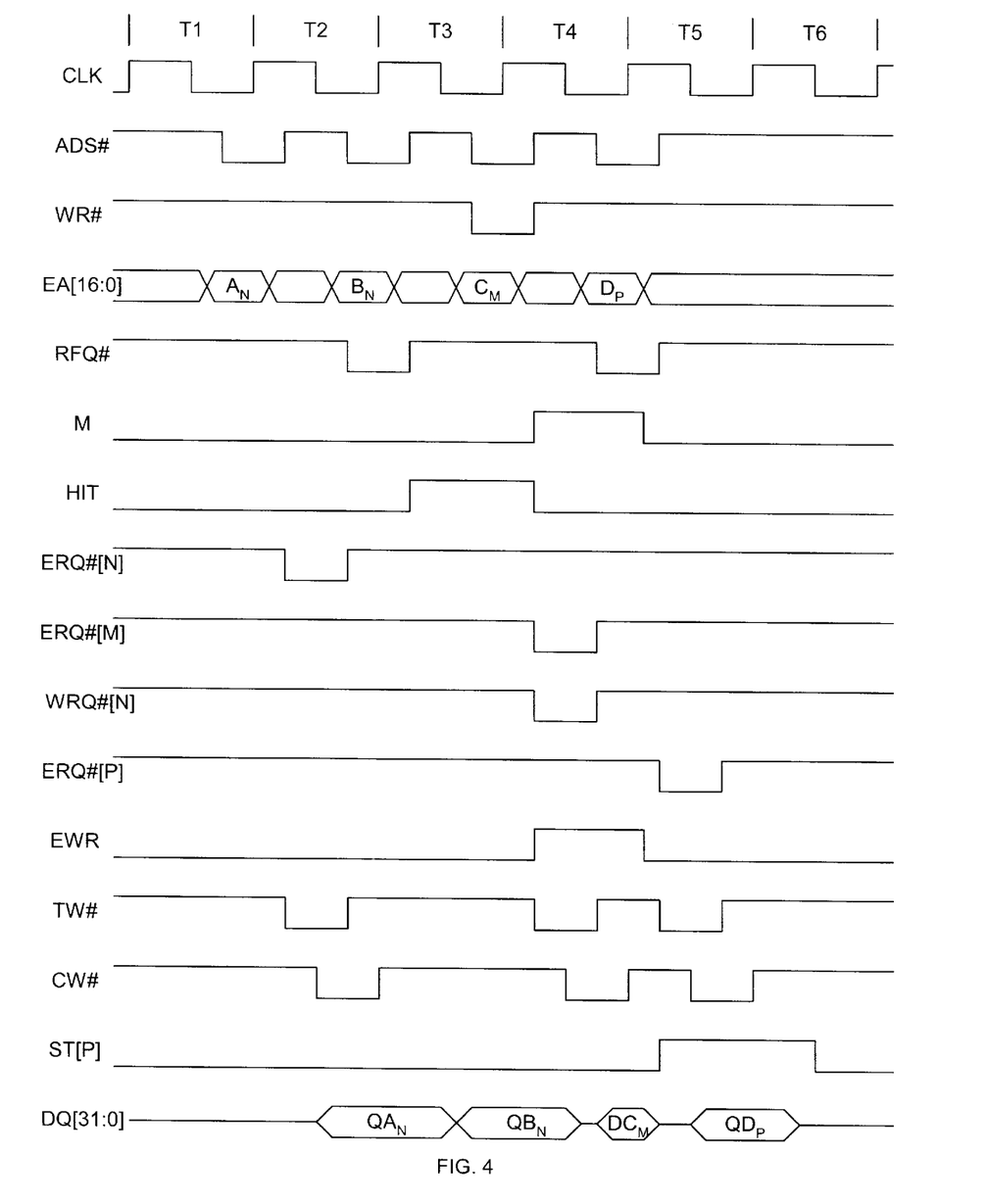
FIG. 4 is a waveform diagram illustrating the timing of four consecutive transactions in accordance with one embodiment of the present invention.

FIG. 4 is a waveform diagram illustrating the timing of four consecutive transactions $A_N$, $B_N$, $C_M$ and $D_P$. Transactions $A_N$ and $B_N$ are accesses to same DRAM bank N. Transaction $C_M$ is an access to DRAM bank M, and transaction $D_P$ is an access to DRAM bank P. More specifically, transaction $A_N$ is a read miss access to DRAM bank N, transaction $B_N$ is a cache hit access to DRAM bank N that collides with a refresh access at the beginning of clock cycle T3, transaction $C_M$ is a write miss transaction to DRAM bank M that requires write-back of modified data to DRAM bank R, and transaction $D_P$ is a read miss access to DRAM bank P.

During clock cycle T1, a memory transaction $A_N$ is initiated with the ADS# signal being driven low, a memory address EA[16:0] being provided to address buffer 181, and the WR# signal being driven high, thereby indicating the transaction is a read access. The memory address EA[16:11] identifies the requested bank address as DRAM bank N. At the rising edge of clock cycle T2, read transaction $A_N$ is detected. The row and column addresses represented by address signals EA[10:3] are buffered by address buffer 181 and are supplied to all of memory banks 0–63, as well as cache tag memory 185. In cache tag memory 185, the cached bank address pointed to by the row and column address is gated out to comparator 184, where it is compared with the bank address EA[16:11] of transaction $A_N$. Comparator 184 drives the HIT signal low, thereby indicating the current transaction $A_N$ is a cache miss. In response to the logic low HIT signal and the current bank address EA[16:11], bank address decoder 182 asserts the read request signal ERQ#[N] low. Note that all of the other read request signals ERQ# are de-asserted high. The modified indicator bit M associated with the cached bank address is provided from cache tag 185 to cache control sequencer 186. In the described example, this modified indicator bit M is low, thereby indicating that the cache entry to be replaced has not been modified. In response, cache control sequencer 186 drives the memory write signal MW# to bank address decoder 183 high. In response, bank address decoder 183 de-asserts all of the write request signals WRQ#[63:0] high, thereby inhibiting a write-back operation.

The low state of read request signal ERQ#[N] causes DRAM bank N to start a memory read cycle. At the same time, cache control sequencer 186 asserts the tag write signal TW# low, thereby causing bank address N to be written to cache tag memory 185 in the location pointed to by address EA[10:3]. In the second half of clock cycle T2, the data read from DRAM bank N is available on bus DB[255:0] and driven to the external data bus DQ[31:0] through the 2:1 multiplexer 192, the 8:1 multiplexer 191 and the I/O driver 190. The data on DB[255:0] is also driven to SRAM cache 187 through multiplexer 193. Since the transaction is a read operation, the external write enable signal EWR# is low, thereby routing all 256 bits of data DB[255:0] to cache write buffer 189 of SRAM cache 187. When the cache write enable signal CW# is asserted low, the data DB[255:0] is written to SRAM cache 187.

At the beginning of clock cycle T3, the read transaction $B_N$ is detected. A refresh request is also detected and latched in every DRAM bank 0–63. Comparator 184 detects a match between the current bank address signal EA[16:11] and the cached bank address provided by cache tag memory 185. In response, comparator 184 asserts a logic high HIT signal. The logic high HIT signal causes all read request signals ERQ#[63:0] and all write request signals WRQ#[63:0] to remain high. In the absence of a cache miss request, all DRAM banks 0–63 start a refresh cycle with the refresh address RA[5:0] being supplied by the corresponding refresh address counter 208 (FIG. 3). Since transaction $B_N$ is a read access, the cache write enable signal CW# stays high and the requested data is transmitted from SRAM cache 187 to cache read buffer 188. Cache read buffer 188 drives the data to 2:1 multiplexer 192 on data bus DA[255:0]. The logic high HIT signal causes multiplexer 192 to route the data from cache read buffer 188 to 8-to-1 multiplexer 191. The buffered word select address EA[2:0] selects one of the eight 32-bit words for output. The selected data is then driven to the external bus DQ[31:0] by I/O drive: 190.

At the beginning of clock cycle T4, write transaction $C_M$ is detected. The DRAM bank address M associated with transaction $C_M$ is provided to cache tag memory 185 and comparator 184. In response, cache tag memory 135 provides the cached bank address R. Comparator 184 determines that the current bank address M does not match the cached bank address R, and in response, drives the HIT signal low to indicate a write miss transaction. In the current example, the modified indicator bit M of the accessed cache tag entry is set, thereby indicating that the associated cache entry in SRAM cache 187 contains modified data that must be written back to DRAM bank R. As a result, both read request signal ERQ#[M] and write request signal WRQ#[R] are asserted low by bank address decoders 182 and 183, respectively, thereby initiating a read operation in DRAM bank M and a write operation in DRAM bank R. The read data from DRAM bank M is output through the transparent latches of read buffer 171 onto the bus DB[255:0]. The read data is latched into read buffer 171 on the falling edge of the CLK signal during cycle T4.

At the same time, cache control sequencer 186 de-asserts the cache write signal CW# high during the first half of cycle T4, thereby causing SRAM cache 187 to perform a read operation. The cache entry to be written back to DRAM bank R is output through transparent latches in cache read buffer 188 onto bus DA[255:0]. The data is latched in cache read buffer 188 at the falling edge of the CLK signal during cycle T4. The cache read data on DA[255:0] is written to DRAM bank R through the DRAM write buffer 172. Similarly, the DRAM read data on DB[255:0] is written to SRAM cache 187 through cache write buffer 189 when the cache write signal CW# is activated low during the second half of clock cycle T4. As a result, the cache entry associated with the current address EA[10:3] is replaced. The bank address M is written to cache tag memory 185, with both the V and M bits set. The modified indicator bit M is set to reflect the fact that the cache line content is modified by the current write transaction $C_M$. Write data is driven from data bus DQ[31:0] through de-multiplexer 194 to multiplexer 193 where the data DB[255:0] retrieved from DRAM bank M is merged with the external write data. The merging is controlled by the word select address on EA[2:0] and the external write signal EWR which is asserted high by cache control sequencer 186. The merged data is written to SRAM cache 187 through cache write buffer 189.

At the beginning of clock cycle T5, both read transaction $D_P$ and a refresh request are detected. During normal operation, the refresh request signal RFQ# is asserted only once in approximately every 32000 lock cycles. The timing shown in FIG. 4 is therefore for illustrative purposes only. In this example, the bank address EA[16:11] associated with read transaction $D_P$ does not match the associated cached bank address stored in cache tag memory 185, thereby causing comparator 184 to provide a logic low HIT signal (i.e., a read miss access). In response to the logic low HIT signal, bank address decoder 182 asserts the read request signal ERQ#[P] low. In the present example, the modified indicator bit M associated with the cached bank address is low, thereby indicating that a write-back operation is not required. As a result, cache control sequencer 186 de-asserts the MW# signal, thereby causing bank address decoder 183 to provide logic high values for each of write request signals WRQ#[63:0]. All of DRAM banks other than DRAM bank P goes through a refresh cycle at this time, as their corresponding ERQ# and WRQ# signals are de-asserted high. In DRAM bank P, the low state of the refresh request signal RFQ# sets the refresh flip-flop 220 formed by NAND gates 212 and 213 (FIG. 3). However, the low state of read request signal ERQ#[P] selects the row address EA[10:5] for the memory cycle. Assertion of read request signal ERQ#[P] causes the signal ST[P] to be asserted high and a memory read cycle to carried out, with the consecutive assertion of the RAS#, CAS#, SEN# and PRC# signals during the clock cycle T5. Read data is output from the DRAM bank P through read buffer 171 to data bus DB[255:0] where it is routed to SRAM cache 187, as well as to multiplexers 192 and 191 and I/O driver 190, and eventually to data bus DQ[31:0]. Since transaction $D_P$ is a read transaction, the external write signal EWR is deactivated low and the entire cache line is written to SRAM cache 187 on the assertion of the cache write signal CW#.

During cycle T6, no external access request is pending. However, the refresh flip-flop 220 in DRAM bank P remains set, thereby causing the signal ST[P] to remain high for the first half of clock cycle T6. As a result, another memory cycle is carried out within DRAM bank P during chock cycle T6. With both the read request signal ERQ#[P] and the write request signal WRQ#[P] de-asserted high, the refresh address RA[5:0] from refresh address counter 208 is passed through multiplexer 210 to row address decoder 205. As a result, the row identified by refresh address RA[5:0] is refreshed. On the falling edge of the CLK signal during cycle T6, the low output of NAND gate 214 is latched into flip-flop 217, thereby driving refresh acknowledge signal RFAK# low and resetting refresh flip-flop 220. The activation of the RFAK# signal also increments refresh address counter 208. However, output of refresh address counter 208 is not incremented until the RFAK# signal is deactivated high. As a result, the refresh address RA[5:0] provided by refresh address counter 208 is held constant during the memory cycle. The refresh acknowledge signal RFAK# is de-activated high on the falling edge of the CLK signal during cycle T7.

In the forgoing manner, 1-T SRAM 1000 can be accessed at a rate of one memory cycle per clock cycle, without any delays for refresh operations.

Although the invention has been described in connection with several embodiments, it is understood that this invention is not limited to the embodiments disclosed, but is capable of various modifications which would be apparent to a person skilled in the art. For example, the DRAM banks and the SRAM cache memory can have different sizes in different embodiments. Similarly, different numbers of DRAM banks can be used. Moreover, buses having different widths than those described can be used in other embodiments. In addition, refresh signals RFQ# having different timing relationships can be provided to different groups of DRAM banks. For example, a first refresh signal RFQ#[1] may be provided to control the refresh a first set of DRAM banks, and a second refresh signal RFQ#[2] may be provided to control the refresh of a second set of DRAM banks. The second refresh signal RFQ#[2] can be asserted one clock cycle later than the first refresh signal RFQ#[1], such that the DRAM banks in the first and second sets are riot refreshed simultaneously. Refreshing the DRAM banks of the first and second sets at different (staggered) times can help to avoid electrical noise problems that may be present if all of the DRAM banks are refreshed at the same time. In other embodiments, more than two staggered refresh signals RFQ# can be used. Thus, the invention is limited only by the following claims.

What is claimed is:

1. A memory device comprising:
   a plurality of memory cells configured in a plurality of banks, wherein each of the memory cells must be refreshed within a predetermined refresh period to retain a data value; and
   a control circuit for accessing and refreshing the memory cells, the control circuit being configured to enable the memory cells to be randomly accessed during each memory cycle without any delays for refresh operations, the control circuit being configured to perform a refresh operation to a bank only if the bank has no pending external access request, and the control circuit being configured to always refresh all of the memory cells within the predetermined refresh period.

2. The memory device of claim 1, wherein the control circuit comprises a static random access memory (SRAM) cache.

3. The memory device of claim 2, wherein the SRAM cache has the same configuration as each of the banks.

4. A memory device comprising:
   a plurality of memory cells configured in a plurality of banks, wherein the memory cells must be periodically refreshed to retain data values; and a control circuit for accessing and refreshing the memory cells, wherein the control circuit controls the accessing and refreshing of the memory cells such that the refreshing of the memory cells does not interfere with any accessing of the memory cells, the control circuit comprising a static random access memory (SRAM) cache, wherein the SRAM cache implements a write-back policy.

5. The memory device of claim 4, wherein the SRAM cache is configured as a direct map cache.

6. A memory device comprising:

a plurality of memory cells configured in a plurality of banks, wherein the memory cells must be periodically refreshed to retain data values; and a control circuit for accessing and refreshing the memory cells, wherein the control circuit controls the accessing and refreshing of the memory cells such that the refreshing of the memory cells does not interfere with any accessing of the memory cells, the control circuit comprising a static random access memory (SRAM) cache, wherein the SRAM cache is configured as a direct map cache.

7. The memory device of claim 1, wherein the control circuit comprises circuitry for independently controlling refresh operations within each bank.

8. The memory device of claim 1, wherein the memory cells are dynamic random access memory (DRAM) cells.

9. The memory device of claim 3, wherein the SRAM cache has a capacity sufficient to ensure that each of the multiple banks is refreshed properly within the refresh period.

10. The memory device of claim 3, further comprising a read buffer, wherein the banks are coupled to the read buffer in parallel, and wherein data read from any one of the banks is provided to the read buffer.

11. A memory device comprising:

a plurality of memory cells configured in a plurality of banks, wherein the memory cells must be periodically refreshed to retain data values;

a control circuit for accessing and refreshing the memory cells, wherein the control circuit controls the accessing and refreshing of the memory cells such that the refreshing of the memory cells does not interfere with any accessing of the memory cells, the control circuit comprising a static random access memory (SRAM) cache;

a read buffer, wherein the banks are coupled to the read buffer in parallel, and wherein data read from any one of the banks is provided to the read buffer; and a cache write buffer coupled between the SRAM cache and the read buffer.

12. A memory device comprising:

a plurality of memory cells configured in a plurality of banks, wherein the memory cells must be periodically refreshed to retain data values;

a control circuit for accessing and refreshing the memory cells, wherein the control circuit controls the accessing and refreshing of the memory cells such that the refreshing of the memory cells does not interfere with any accessing of the memory cells, the control circuit comprising a static random access memory (SRAM) cache;

a write buffer, wherein the banks are coupled to the write buffer in parallel, and wherein data is written from the write buffer to any one of the banks.

13. The memory device of claim 12, further comprising a cache read buffer coupled between the SRAM cache and the write buffer.

14. A memory device comprising:

a plurality of memory cells configured in a plurality of banks, wherein the memory cells must be periodically refreshed to retain data values;

a control circuit for accessing and refreshing the memory cells, wherein the control circuit controls the accessing and refreshing of the memory cells such that the refreshing of the memory cells does not interfere with any accessing of the memory cells, the control circuit comprising a static random access memory (SRAM) cache;

a read buffer, wherein the banks are coupled to the read buffer in parallel, and wherein data read from any one of the banks is provided to the read buffer; and a write buffer, wherein the banks are coupled to the write buffer in parallel, and wherein data is written from the write buffer to any one of the banks.

15. The memory device of claim 14, further comprising:

a cache read buffer coupled between the SRAM cache and the write buffer; and a cache write buffer coupled between the SRAM cache and the read buffer.

16. A method of operating a multi-bank memory comprising a plurality of memory cells that each must be refreshed within a predetermined refresh period to retain a data value, the method comprising the steps of:

receiving external access requests to the multi-bank memory;

generating refresh requests within the multi-bank memory;

immediately processing each of the external access requests; and processing a refresh request to a bank of the multi-bank memory only if the bank has no pending external access request, whereby all of the memory cells are always refreshed within the predetermined refresh period.

17. A method of operating a multi-bank memory comprising a plurality of memory cells that require periodic refreshing and an SRAM cache, the method comprising the steps of:

comparing a current access address with a cached address stored in the SRAM cache to determine when a cache miss occurs;

accessing one of the banks identified by the current access address or the cached address when a cache miss occurs and a cache entry associated with the cached address is consistent with data stored by the memory cells;

accessing both of the banks identified by the current access address and the cached address when a cache miss occurs and a cache entry associated with the cached address is not consistent with data stored by the memory cells;

generating refresh requests within the multi-bank memory; and performing a refresh operation for a bank of the multi-bank memory in response to a refresh request only if the bank is not being accessed because a cache miss has occurred.

18. The method of claim 17, further comprising the step of operating the multi-bank memory at a peak operating frequency equal to or greater than a peak access frequency of an external device accessing the multi-bank memory.

19. A method of operating a multi-bank memory comprising plurality of memory banks having a plurality of memory cells that require periodic refreshing and an SRAM cache, the method comprising the steps of:

comparing an external access address with a cached address stored in the SRAM cache to determine when a cache hit or a cache miss occurs;

generating refresh requests within the multi-bank memory;

determining if a refresh request is pending within a memory bank; and refreshing the memory bank in response to a pending refresh request only when a cache hit occurs or when the memory bank is not accessed as a result of a cache miss or when there is no external access.

20. The method of claim 19, further comprising the following steps when a cache miss occurs:

determining whether a cache entry associated with the cached address has been modified;

writing the cache entry back to a memory bank associated with the cached address if the cache entry has been modified; and reading a new cache entry from a memory bank identified by the external access address;

writing the new cache entry to the SRAM cache.

21. The method of claim 19, further comprising the step of reading the new cache entry from the memory bank identified by the external access address if the cache entry has not been modified, and writing the new cache entry to the SRAM cache.

22. The method of claim 19, further comprising the step of not accessing the memory banks in response to the external access address if a cache hit occurs.

23. The method of claim 19, further comprising the steps of:

writing external write data directly to the SRAM cache, but not directly to the memory banks; and transferring external write data from the SRAM cache to the memory banks only when a cache miss occurs and a cache entry associated with the cache miss has been modified.

24. The method of claim 19, further comprising the following steps when a cache miss occurs:

transferring a cache entry from the SRAM cache to a first memory bank: and simultaneously transferring a cache entry from a second memory bank to the SRAM cache.

25. The method of claim 24, wherein the steps of transferring comprise simultaneous operations in the first memory bank and the second memory bank.

26. The method of claim 24, wherein the steps of transferring are both performed within one clock period.

* * * * *

UNITED STATES PATENT AND TRADEMARK OFFICE
CERTIFICATE OF CORRECTION

PATENT NO. : 5,999,474
DATED : December 7, 1999
INVENTOR(S) : Wingyu Leung, et. al.

It is certified that error appears in the above-identified patent and that said Letters Patent is hereby corrected as shown below:

Title page, item [73], Assignee: insert-- Monolithic System Ttechnology, Inc., Sunnyvale, CA.--.

Signed and Sealed this

Twenty-fourth Day of October, 2000

Attest:

Q. TODD DICKINSON

*Attesting Officer*      *Director of Patents and Trademarks*

UNITED STATES PATENT AND TRADEMARK OFFICE
CERTIFICATE OF CORRECTION

PATENT NO. : 5,999,474

DATED : December 7, 1999

INVENTOR(S) : Wingyu Leung, et al.

It is certified that error appears in the above-identified patent and that said Letters Patent is hereby corrected as shown below:

On the title page, insert Item [73],
    --Assignee: Monolithic System Technology, Inc., Sunnyvale, CA--

This certificate supercedes certificate of correction issued October 24, 2000.

Signed and Sealed this

Ninth Day of January, 2001

*Attest:*

Q. TODD DICKINSON

*Attesting Officer*      *Commissioner of Patents and Trademarks*

UNITED STATES PATENT AND TRADEMARK OFFICE
CERTIFICATE OF CORRECTION

PATENT NO : 5,999,474
DATED : December 7, 1999
INVENTOR(S) : Wingyu Leung et al.

It is certified that error appears in the above-identified patent and that said Letters Patent is hereby corrected as shown below:

Col. 2, line 14 replace "externaL" with --external--.

Col. 2, line 44 replace "bank,." with --banks.--.

Col. 3, line 30 replace "accese" with --access--.

Col. 5, line 39 replace "Latches" with --latches--.

Col. 6, line 57 replace "1837" with --187--.

Col 8, line 20 replace "bank:" with --bank--.

Col 8, line 27 replace "iE." with --is.--.

Col 8, line 34 replace "adoress" with --address--.

UNITED STATES PATENT AND TRADEMARK OFFICE
CERTIFICATE OF CORRECTION

PATENT NO : 5,999,474
DATED : December 7, 1999
INVENTOR(S) : Wingyu Leung et al.

It is certified that error appears in the above-identified patent and that said Letters Patent is hereby corrected as shown below:

Col 8, line 42 replace "e" with --a--.

Col 11, line 18 replace "WFRQ" with --WRQ--.

Col 12, line 47 replace "drive:" with --driver--.

Col 12, line 51 replace "135" with --185--.

Col 13, line 29 replace "lock" with --clock--.

Col 13, line 66 replace "chock" with --clock--.

Col 14, line 36 replace "riot" with --not--..

UNITED STATES PATENT AND TRADEMARK OFFICE
CERTIFICATE OF CORRECTION

PATENT NO : 5,999,474
DATED : December 7, 1999
INVENTOR(S) : Wingyu Leung et al.

It is certified that error appears in the above-identified patent and that said Letters Patent is hereby corrected as shown below:

Col 15, line 27 replace "claim 3" with --claim 2--..

Col 15, line 31 replace "claim 3" with --claim 2--.

Col 17, line 26 replace "claim 19" with --claim 20--.

Signed and Sealed this

Twenty-third Day of January, 2001

Attest:

Attesting Officer

Q. TODD DICKINSON

Commissioner of Patents and Trademarks